US008784977B2

(12) United States Patent
Miura

(10) Patent No.: US 8,784,977 B2
(45) Date of Patent: Jul. 22, 2014

(54) COATED CUBIC BORON NITRIDE SINTERED BODY TOOL

(75) Inventor: Hiroyuki Miura, Iwaki (JP)

(73) Assignee: Tungaloy Corporation, Fukushima (JP)

( * ) Notice: Subject to any disclaimer, the term of this patent is extended or adjusted under 35 U.S.C. 154(b) by 329 days.

(21) Appl. No.: 13/380,411

(22) PCT Filed: Jun. 22, 2009

(86) PCT No.: PCT/JP2009/061295

§ 371 (c)(1), (2), (4) Date: Dec. 22, 2011

(87) PCT Pub. No.: WO2010/150335

PCT Pub. Date: Dec. 29, 2010

(65) Prior Publication Data

US 2012/0090247 A1 Apr. 19, 2012

(51) Int. Cl.

*B23B 27/14* (2006.01)
*C23C 28/04* (2006.01)
*C23C 14/00* (2006.01)
*C04B 35/5831* (2006.01)
*C23C 14/06* (2006.01)

(52) U.S. Cl.

CPC ....... *C23C 14/0036* (2013.01); *C04B 2235/402* (2013.01); *C23C 28/044* (2013.01); *C23C 28/042* (2013.01); *C04B 2235/386* (2013.01); *C04B 2235/3886* (2013.01); *C04B 35/5831* (2013.01); *C23C 14/0641* (2013.01)

USPC ............... 428/216; 51/307; 51/309; 428/336; 428/457; 428/472; 428/697; 428/698; 428/699

(58) Field of Classification Search

USPC ............ 51/307, 309; 428/216, 336, 457, 472, 428/697, 698, 699

See application file for complete search history.

(56) References Cited

U.S. PATENT DOCUMENTS

| | | | | |
|---|---|---|---|---|
| 3,971,656 | A | 7/1976 | Rudy | |
| 4,778,521 | A | 10/1988 | Iyori et al. | |
| 5,308,376 | A | 5/1994 | Oskarsson | |
| 5,853,873 | A | 12/1998 | Kukino et al. | |
| 5,882,777 | A | 3/1999 | Kukino et al. | |
| 5,939,651 | A | 8/1999 | Isobe et al. | |
| 6,057,046 | A | 5/2000 | Tsuda et al. | |
| 6,299,992 | B1 | 10/2001 | Lindskog et al. | |
| 7,226,670 | B2 * | 6/2007 | Derflinger et al. | 428/697 |
| 7,348,074 | B2 * | 3/2008 | Derflinger | 428/699 |
| 7,537,822 | B2 * | 5/2009 | Ishikawa | 428/697 |
| 7,901,796 | B2 * | 3/2011 | Fukui et al. | 428/697 |
| 7,947,363 | B2 * | 5/2011 | Xu et al. | 428/698 |
| 2003/0175536 | A1 * | 9/2003 | Penich et al. | 428/469 |
| 2004/0002418 | A1 | 1/2004 | Scurlock et al. | |
| 2004/0237840 | A1 | 12/2004 | Yamamoto et al. | |
| 2006/0222893 | A1 | 10/2006 | Derflinger | |
| 2006/0269788 | A1 | 11/2006 | Ishikawa | |
| 2007/0234646 | A1 | 10/2007 | Can et al. | |
| 2007/0269610 | A1 | 11/2007 | Fukui et al. | |
| 2008/0254282 | A1 | 10/2008 | Kukino et al. | |
| 2009/0049953 | A1 | 2/2009 | Shindo et al. | |
| 2011/0117368 | A1 | 5/2011 | Matsubara et al. | |
| 2012/0003466 | A1 | 1/2012 | Tamura et al. | |
| 2012/0114960 | A1 | 5/2012 | Takesawa et al. | |

FOREIGN PATENT DOCUMENTS

| | | |
|---|---|---|
| DE | 19704242 C1 | 8/1998 |
| EP | 1714942 | 10/2006 |
| JP | 61-195950 | 8/1986 |
| JP | 61-227910 | 10/1986 |
| JP | 62-193731 | 8/1987 |
| JP | 62-265107 | 11/1987 |
| JP | 64-068443 | 3/1989 |
| JP | 02-015139 | 1/1990 |
| JP | 02-093036 | 4/1990 |
| JP | 04-231467 | 8/1992 |
| JP | 08-309605 | 11/1996 |
| JP | 09-078174 | 3/1997 |
| JP | 02-628200 | 7/1997 |
| JP | 10-110234 | 4/1998 |
| JP | 2000-44348 | 2/2000 |
| JP | 03-152105 | 4/2001 |

(Continued)

OTHER PUBLICATIONS

Barshilia et al "Growth and characterization of TiAIN/CrAIN superlattices prepared by reactive direct current magnetron sputtering" J.Vac Sci. Technol. A 27(1) Jan./Feb. 2009 p. 29-36.*

Official action dated Aug. 13, 2013 issued in Japanese counterpart application (No. 2011-519398) with English translation.

M. Pancielejko et al "Structure, chemical and phase composition of hard titanium carbon nitride coatings deposited on HS 6-5-2 steel" *Journal of Materials Processing Technology,* 2004, vol. 157-158, pp. 394-398.

(Continued)

*Primary Examiner* — Archene Turner

(74) *Attorney, Agent, or Firm* — Womble Carlyle Sandridge & Rice, LLP

(57) ABSTRACT

A cubic boron nitride sintered substrate has a coating with lower and upper layers. The upper layer has an average layer thickness of 0.5 to 3.0 μm and is formed from a compound of a compositional formula Mα, where M represents one or more of Ti, V, Zr, Nb, Mo, Al, Si, and α is one or more of C, N, B and O. The lower layer has an average thickness of 0.5 to 3.0 μm and has alternated first and second thin layers. The first thin layer is formed from a compound with compositional formula $(Ti_{(1-x)}L_x)\beta$, where L is one or more of Al, B and Si, and β is C or N, or both. The second thin layer is formed with compositional formula $(Al_{(1-y)}J_y)\gamma$, where J represents one or more of Ti, V, Cr, Zr, Nb and Mo, and γ is C or N, or both.

18 Claims, No Drawings

(56) References Cited

FOREIGN PATENT DOCUMENTS

| | | |
|---|---|---|
| JP | 2001-181825 | 7/2001 |
| JP | 2002-302732 | 10/2002 |
| JP | 2003-136305 | 5/2003 |
| JP | 2004-292842 | 10/2004 |
| JP | 2005-194573 | 7/2005 |
| JP | 2005-200668 | 7/2005 |
| JP | 2006-111947 | 4/2006 |
| JP | 2006-315898 | 11/2006 |
| JP | 2007-084382 | 4/2007 |
| JP | 2008-188689 | 8/2008 |
| JP | 2008-208027 | 9/2008 |
| JP | 2009-034781 | 2/2009 |
| JP | 2009-067637 | 4/2009 |
| JP | 2010-031308 | 2/2010 |
| WO | WO 98/34874 | 8/1998 |

OTHER PUBLICATIONS

Takayuki Murotani et al "Study on stress measurement of PVD-coating layer" *Thin Solid Films,* 2000, vol. 377-378, pp. 617-620.

International Preliminary Report on Patentability (IPRP) dated Jan. 17, 2012 issued in counterpart PCT Application No. PCT/JP2009/061295.

International Search Report in PCT/JP2009/061295, dated Jul. 21, 2009.

Kikai Gijutu (2009) vol. 57, No. 4, pp. 32-37 with English translation (extract).

Suzuki, Hard Alloy and Sintered Hart Material (1986) p. 329, fig. 2.34.

Zhang S, et al "Solid Solution Extent of WC and TaC in Ti(C,N) as Revealed by Lattice Parameter Increase", Int. J. of Refractory Metals & Hard Materials, vol. 12, No. 6 (Jan. 1, 1993) pp. 329-333.

* cited by examiner

COATED CUBIC BORON NITRIDE SINTERED BODY TOOL

RELATED APPLICATIONS

This is a 371 US National Phase of International Patent Application No. PCT/JP2009/061295, filed Jun. 22, 2009, and published as WO 2010/150335A1 on Dec. 29, 2010. The contents of the aforementioned application are incorporated by reference in their entirety.

TECHNICAL FIELD

The present invention relates to a coated cubic boron nitride sintered body tool at least whose blade edge comprises a coated cubic boron nitride sintered body.

BACKGROUND ART

A cubic boron nitride sintered body has high hardness and excellent thermal conductivity, so that it has been used as a cutting tool for hardened steel or heat-resistant alloy, etc. In recent years, for the purpose of improving machining efficiency, a coated cubic boron nitride sintered body tool in which a coating layer is coated on the surface of a cubic boron nitride sintered body substrate has been used.

Prior art techniques of the coated cubic boron nitride sintered body tool include a composite highly hard material for hardened steel-cutting tool in which the surface of a substrate comprising a CBN sintered body containing 20% by volume or more of cubic type boron nitride is coated with a membrane of TiAlN wherein an atomic ratio X of Ti/(Ti+Al) is $0.3 \leq X \leq 0.5$ (for example, see Patent Literature 1.). However, when the material is used as a cutting tool and a cutting speed becomes high speed, that the temperature of a blade edge of the tool becomes high, whereby there are produced problems that the TiAlN membrane is thermally decomposed and oxidized, and the coated membrane is peeled off from the surface of the substrate to cause abnormal wear.

Further, there is a cutting tool made of a surface-coated cubic boron nitride-based ultra-high pressure sintered material wherein a hard coating layer comprising a lower layer of a complex nitride layer of Ti and Al satisfying $[Ti_{1-X}Al_X]N$ (X represents 0.4 to 0.6), and an upper layer which has an alternately laminated layer structure comprising a thin layer A of a complex nitride layer of Ti and Al satisfying $[Ti_{1-X}Al_X]N$ (X represents 0.4 to 0.6) and a thin layer B of a Cr nitride layer is formed by deposition (for example, see Patent Literature 2.). However, this cutting tool involves a problem that it causes abnormal wear due to breakage of the hard coating layer since Cr in the upper layer is diffused into the hard coating layer accompanied by increase of temperature of the blade edge of the tool in machining of a hardened steel.

[Patent Literature 1] JP 3866305B
[Patent Literature 2] JP 2008-18504A

DISCLOSURE OF THE INVENTION

Problems to be Solved by the Invention

An object of the present invention is to provide a coated cubic boron nitride sintered body tool capable of inhibiting peeling of the coating layer, etc., due to progress of wear or oxidation which are the problems of the conventional coated cubic boron nitride sintered body tool, and capable of elongating a tool lifetime.

Means to Solve the Problems

The present inventor has made a study on elongating lifetime of a coated cubic boron nitride sintered body to be used for severe cutting machining such as high-load machining or high efficiency machining, and as a result, he has found that a coated cubic boron nitride sintered body tool having a coating layer comprising an upper layer excellent in wear resistance and heat resistance, and a lower layer in which first thin layer of a Ti-containing complex compound having high hardness and low Young's modulus and having an average layer thickness of 60 to 200 nm and a second thin layer of an Al-containing complex compound having low hardness and high Young's modulus and having an average layer thickness of 60 to 200 nm are laminated alternately, can realize the elongation of tool lifetime.

The present invention is a coated cubic boron nitride sintered body tool which is a coated cubic boron nitride sintered body tool at least whose blade edge comprises a cubic boron nitride sintered body where the surface of the cubic boron nitride sintered body substrate is coated with a coating layer, wherein the coating layer contains a lower layer at the substrate side and an upper layer thereon, (1) the upper layer is a layer which comprises a compound represented by a compositional formula $M\alpha$ (provided that M represents at least one element selected from Ti, V, Zr, Nb, Mo, Al and Si, and a represents at least one element selected from C, N, B and O.) and has an average layer thickness of 0.5 to 3.0 μm, (2) the lower layer is an alternately laminated material in which a first thin layer comprising a compound represented by the compositional formula $(Ti_{(1-x)}L_x)\beta$ (provided that L represents at least one element selected from Al, B and Si, x represents an atomic ratio of L based on the sum of Ti and L, and satisfies $0.01 \leq x \leq 0.7$, and represents at least one element selected from C and N.) and having an average layer thickness of 60 to 200 nm, and a second thin layer comprising a compound represented by the compositional formula $(Al_{(1-y)}J_y)\gamma$ (provided that J represents at least one element selected from Ti, V, Cr, Zr, Nb and Mo, y represents an atomic ratio of J based on the sum of Al and J, and satisfies $0.1 \leq y \leq 0.5$, and $\gamma$ represents at least one element selected from C and N.) and having an average layer thickness of 60 to 200 nm, are laminated alternately, and an average layer thickness of the alternately laminated material is 0.5 to 3.0 μm.

The cubic boron nitride sintered body substrate of the present invention can be obtained by sintering 20% by volume or more of cubic boron nitride powder and 80% by volume or less of binder phase-forming powder under ultra-high pressure and high temperature. The binder phase-forming powder of the present invention comprises at least one selected from metal elements of Groups 4a, 5a and 6a of the Periodic Table, a metal of Al, Si, Mg, Co, Ni, and alloys, nitrides, carbides, borides and oxides of these metals and mutual solid solutions thereof. Specific examples of the binder phase-forming powder of the present invention include Co, Ni, Mn, Al, Si and alloys thereof, TiN, TiC, TiCN, $TiB_2$, WC, $WB_2$, $W_2CoB_2$, $Al_2O_3$, MN, $AlB_{12}$ and mutual solid solutions thereof, etc.

The surface of the cubic boron nitride sintered body substrate of the present invention is coated with a coating layer. The coating layer of the present invention contains a lower layer at the substrate side and an upper layer at the surface side. Incidentally, the coating layer of the present invention may further contain, in addition to the lower layer and the upper layer, a bottom layer between the substrate and the lower layer, or an intermediate layer between the lower layer and the upper layer.

The upper layer of the present invention comprises a compound represented by the compositional formula $M\alpha$ (provided that M represents at least one element selected from Ti, V, Zr, Nb, Mo, Al and Si, and $\alpha$ represents at least one element selected from C, N, B and O.) and having an average layer thickness of 0.5 to 3.0 μm. According to this constitution, wear resistance and heat resistance can be improved. Of these, when the compound is TiN, TiCN, $Al_2O_3$ or TiAlN, strength at high temperatures is heightened so that it is preferred. The average layer thickness of the upper layer is 0.5 to 3.0 μm. If the average layer thickness of the upper layer is 0.5 μm or more, the upper layer is not so thin, and the effects of improving both of wear resistance and heat resistance can be obtained. If the average layer thickness of the upper layer is 3.0 μm or less, occurrence of chipping at the initial stage of the machining can be restrained. The average layer thickness of the upper layer is more preferably 1.0 to 2.0 μm. Here, an average layer thickness of an upper layer was measured in a SEM observation by an average value of 5 views of the photograph, with a sectional surface of the upper layer being enlarged by 5000 to 30000-folds. Further, otherwise specifically mentioned, the average layer thickness means an average value obtained by photographing sectional surfaces of the respective coated layers with 5 views by SEM or TEM.

Moreover, if the upper layer is an upper layer whose full width at half maximum intensity (FWHM) of a diffraction line having the highest peak intensity among the diffraction lines obtained by an X-ray diffraction analysis using Cu—Kα radiation is 0.80° or less, grains constituting the upper layer become large and drop of the grains occurs less, whereby progress of wear due to drop of the grains can be inhibited so that it is more preferred. When the upper layer is TiN or TiAlN, the FWHM is still more preferably 0.35° or less, and when the upper layer is TiCN, the FWHM is still more preferably 0.75° or less.

The FWHM of the upper layer of the present invention can be measured by the commercially available X-ray diffraction device. More specifically, in a $2\theta/\theta$ series X-ray diffraction measurement using Cu—Kα radiation, it can be measured under the measurement conditions of output: voltage 50 kV, current 250 mA, step width: 0.02°, $2\theta$ measurement range: 4° to 140°. Incidentally, when a diffraction line of the upper layer and other diffraction line(s) are overlapped, it is recommendable to carry out peak separation by analysis software attached to the X ray diffraction device.

The lower layer of the present invention comprises an alternately laminated material of a first thin layer which comprises a Ti series complex compound with high hardness and low Young's modulus and a second thin layer which comprises an Al series complex compound with low hardness and high Young's modulus, and the alternately laminated material provide excellent cutting properties to a tool. The first thin layer comprises a layer which comprises a compound represented by the compositional formula $(Ti_{(1-x)}L_x)\beta$ (provided that L represents at least one element selected from Al, B and Si, x represents an atomic ratio of L based on the sum of Ti and L, and satisfies $0.01 \leq x \leq 0.7$, and $\beta$ represents at least one element selected from C and N.) and has an average layer thickness of 60 to 200 nm. The first thin layer has high hardness and low Young's modulus. The atomic ratio x is $0.01 \leq x \leq 0.7$. When x is 0.01 or more, sufficient hardness can be obtained, and when x is 0.7 or less, strength of the first thin layer is never lowered. Of these, if x is $0.4 \leq x \leq 0.7$ when L is Al, or is $0.01 \leq x \leq 0.3$ when L is Si or B, it is more preferred since hardness of the first thin layer is heightened.

The second thin layer of the present invention comprises a layer which comprises a compound represented by the compositional formula $(Al_{(1-y)}J_y)\gamma$ (provided that J represents at least one element selected from Ti, V, Cr, Zr, Nb and Mo, y represents an atomic ratio of J based on the sum of Al and J, and satisfies $0.1 \leq y \leq 0.5$, and $\gamma$ represents at least one element selected from C and N.) and has an average layer thickness of 60 to 200 nm. The second thin layer has low hardness and high Young's modulus. J of the second thin layer represents at least one element selected from Ti, V, Cr, Zr, Nb and Mo, and of these, when J is at least one element selected from Cr, Ti and Zr, it is preferred since strength of the second thin layer is heightened. Of them, J is more preferably Cr. The atomic ratio y is $0.1 \leq y \leq 0.5$. If y is 0.1 or more, and y is 0.5 or less, decrease in hardness can be restrained. Of these, it is more preferably $0.2 \leq y \leq 0.4$.

The average layer thicknesses of the first thin layer and the second thin layer in the lower layer of the present invention are each 60 to 200 nm. If the average layer thickness is 60 nm or more, fine granulation in grain size of the first thin layer and the second thin layer due to increase in frequency of producing cores at the time of coating can be restrained, and drop of thin layer grains can be prevented at the time of cutting so that progress of wear can be restrained. If the average layer thickness is 200 nm or less, a preventing effect in propagation of crack can be retained so that fracture resistance is never lowered. Of these, average layer thicknesses of the first thin layer and the second thin layer in the lower layer are each more preferably 70 to 150 nm. Here, the average layer thicknesses of the first thin layer and the second thin layer in the lower layer were measured by an average value of 5 views of the photograph in an SEM observation, with the sectional surface of the lower layer being enlarged by 30000 to 100000-folds. Incidentally, the average layer thickness may be measured by carrying out a TEM observation other than the SEM observation.

The lower layer is provided by alternately laminating the first thin layer and the second thin layer each one layer or more. An average layer thickness of the whole lower layer as an alternately laminated material of the present invention is 0.4 to 3.0 μm. If the average layer thickness of the whole lower layer is 0.4 μm or more, a preventing effect in propagation of crack by impact of machining can be retained, and if it is 3.0 μm or less, occurrence of chipping can be restrained. Of these, the average layer thickness of the whole lower layer of the present invention is more preferably 1.0 to 2.0 μm.

When a bottom layer comprising a compound represented by the compositional formula $(Al_{(1-y)}Cr_y)N$ (provided that y represents an atomic ratio of Cr based on the sum of Al and Cr, and satisfies $0.2 \leq y \leq 0.4$.) is present between the cubic boron nitride sintered body substrate and the lower layer of the present invention, adhesion between the coating layer and the cubic boron nitride sintered body substrate is improved so that it is preferred. An average layer thickness of the bottom layer is preferably 60 to 200 nm. If the average layer thickness of the bottom layer is 60 nm or more, sufficient adhesion can be obtained, while if it is 200 nm or less, a preventing effect in propagation of crack by impact of machining can be retained, so that fracture resistance or chipping resistance is never lowered. Of these, the average layer thickness of the bottom layer is more preferably 70 to 150 nm.

Further, when an intermediate layer comprising a metal comprising the component M of the upper layer and having an average layer thickness of 5 to 100 nm is present between the lower layer and the upper layer of the present invention, it is preferred since adhesion between the lower layer and the upper layer is improved. When the intermediate layer comprises a metallic phase comprising the component M of the upper layer, it is preferred since adhesion between the lower layer and the upper layer is improved, and peeling of the lower layer and the upper layer can be prevented. The average layer thickness of the intermediate layer is preferably 5 to 100 nm. If the average layer thickness of the intermediate layer is 5 nm or more, an effect of improving adhesion between the lower layer and the upper layer can be obtained, and if it is 100 nm or less, wear resistance is never lowered. Of these, the average layer thickness of the intermediate layer is more preferably 50 to 80 nm.

At least a blade edge of the coated cubic boron nitride sintered body tool of the present invention comprises the coated cubic boron nitride sintered body of the present invention. What is other than the blade edge may be a cubic boron nitride sintered body to be used for the substrate in the present invention, or may be a material different from the cubic boron nitride sintered body, for example, a cemented carbide. More specifically, the cubic boron nitride sintered body of the present invention is attached to the blade edge portion of a cemented carbide processed into a cutting tool-shape by brazing, thereafter, the coating layer of the present invention may be coated on the surface of the cubic boron nitride sintered body of the present invention.

As a method for coating the coating layer of the present invention, there may be mentioned a method in which after washing the surface of the cubic boron nitride sintered body substrate using an organic solvent or water with ultrasonic wave, a coating layer is coated by the conventionally conducted PVD method, CVD method or plasma CVD method. Of these, PVD method is preferred since it can easily adjust the layer thickness and is excellent in adhesion with the substrate. As the PVD method, arc ion plating method or magnetron sputtering method, etc., may be mentioned. The arc ion plating method has high ionization ratio of a metal element or is capable of metal ion bombardment treatment on the surface of the substrate before coating a coating layer, and is excellent in adhesion of the coating layer and the substrate, so that it is more preferred.

Effects of the Invention

The coated cubic boron nitride sintered body tool of the present invention has realized elongation of tool lifetime by restraining abnormal wear such as progress of wear due to drop of grains of a coating layer or peeling off of the coating layer by thermal decomposition, improving thermal stability of the coating layer at high temperatures not to lower tool strength. In particular, it has high effects of elongating tool lifetime in a high load cutting machining or high efficiency cutting machining such as a hardened steel machining.

EMBODIMENT TO CARRY OUT THE INVENTION

Examples

Coated cubic boron nitride sintered body tools of Present products 1 to 3, 7, 9, 10, 12, 13, 16, 18 and 20 to 24 were prepared by successively forming the bottom layer, lower layer, intermediate layer and upper layer having the compositions and layer thicknesses shown in Table 1 according to the following conditions onto the substrate prepared by the following method.

(1) Preparation of Substrate

Mixed powders of binder phase-forming powder comprising 35% of TiN and 10% of Al in volume and 55% of cubic boron nitride powder in volume were sintered at ultra-high pressure and high temperature conditions of a pressure of 5.5 GPa, and a temperature of 1773K to obtain a cubic boron nitride sintered body. By using ISO standard CNGA 120408-shaped cemented carbide as a base, and the obtained cubic boron nitride sintered body was attached by brazing at the corner portion of the cemented carbide base to become a blade edge. The upper and bottom surface and peripheral surface of the substrate was subjected to polishing by a diamond whetstone of #270 mesh, and subsequently, chamfer honing with an angle of −25° x a width of 0.15 mm was applied to a ridge line of a cutting blade with a diamond whetstone of #400 mesh. Moreover, a rotary brush was pressed to a ridge line of a flank and a chamfer honing surface to carry out round honing machining. While regulating a machining time, round honing having a desired curvature radius was applied thereto by measuring with a contracer. After machining, the substrate was washed with ethanol and acetone, and then, vacuum drying treatment was carried out.

The substrate was mounted on a rotary table in an arc ion plating device, and metal targets corresponding to metal elements of the coating layer shown in Table 1 were each provided as a cathode electrode (evaporation source). First, the inner portion of the device was exhausted, and while heating to 500° C. by a heater, vacuum suction was carried out until the pressure in the device became $1.0\times10^{-4}$ Pa. Next, argon gas was introduced therein, the pressure in the device was maintained at 0.7 Pa, in the state of rotating the table, a substrate direct current bias voltage of −200V was applied to the substrate, the surface of the substrate was washed with argon ions, and thereafter, argon gas was exhausted from inside of the device.

(2) Formation of Bottom Layer

With regard to Present products 1 to 3, 9, 10, 12, 13, 16, 18 and 20 to 24 except for Present product 7, in the state of rotating the table, a flow amount of nitrogen gas which is a reaction gas to be introduced into the device was adjusted to set pressure in the device at 3.0 Pa, a substrate direct current bias voltage was adjusted to −40V, an arc current of 150 A was supplied to the cathode electrode in which metal targets corresponding to the metal elements of the bottom layer shown in Table 1 were provided, a discharge time was changed in the range of 5 to 15 minutes depending on a thickness of a layer to be formed to coat the bottom layer, and then, arc discharge was stopped.

(3) Formation of Lower Layer

Subsequently, with regard to Present products 1 to 3, 7, 9, 10, 12, 13, 16, 18 and 20 to 24, in the state of rotating the table, a flow amount of nitrogen gas (in Present product 24, nitrogen gas and acetylene gas with a flow ratio (volume ratio) of 2:1) which is a reaction gas to be introduced into the device was adjusted to set pressure in the device at 3.0 Pa, an arc current of 150 A was supplied to a cathode electrode arranging metal targets corresponding to metal elements of the first thin layer of the lower layer shown in Table 1 while maintaining a substrate direct current bias voltage at −40V, and a discharge time was changed in the range of 5 to 20 minutes depending on a thickness of a layer to be formed to coat the first thin layer of the lower layer. After coating the first thin layer, the arc discharge was stopped, and an arc current of 150 A was supplied to a cathode electrode arranging metal targets corresponding to metal elements of the second thin layer of the lower layer shown in Table 1, and a discharge time was changed in the range of 8 to 25 minutes depending on a thickness of a layer to be formed to coat the second thin layer of the lower layer. These processes were repeated whereby the alternately laminated lower layer in which the first thin layer and the second thin layer had been alternately laminated with each 5 to 9 layers was coated, and then, the arc discharge was stopped and nitrogen gas which is the reaction gas (in Present product 24, nitrogen gas and acetylene gas) was exhausted. Incidentally, the discharge time for forming a thin layer varies depending on a kind of the metal targets in addition to a layer thickness.

(4) Formation of Intermediate Layer

After coating the lower layer which had been alternately laminated, with regard to Present products 1 to 3, 9, 10, 12, 13, 16, 18 and 20 to 24 except for Present product 7, argon gas was introduced, pressure in the device was maintained at 3.0 Pa, in the state of applying a substrate direct current bias voltage of −40V to the substrate, an arc current of 100 A was supplied to a cathode electrode arranging metal targets corresponding to metal elements of an intermediate layer shown in Table 1, a discharge time was changed in the range of 2 to 15 minutes depending on a thickness of a layer to be formed to coat an intermediate layer, and then, the arc discharge was stopped and argon gas was exhausted.

(5) Formation of Upper Layer

Subsequently, with regard to Present products 1 to 3, 7, 9, 10, 12, 13, 16, 18 and 20 to 24, a flow amount of nitrogen gas which is a reaction gas to be introduced into the device was adjusted to set pressure in the device at 3.0 Pa, while maintaining a substrate direct current bias voltage at −40V, an arc current of 150 A was supplied to a cathode electrode arranging metal targets corresponding to metal elements of the upper layer shown in Table 1, a discharge time was changed in the range of 30 to 200 minutes depending on a thickness of a layer to be formed to coat the upper layer, and then, the arc discharge was stopped and nitrogen gas which is the reaction gas was exhausted. According to the above procedure, the coated cubic boron nitride sintered body tools of Present products 1 to 3, 7, 9, 10, 12, 13, 16, 18 and 20 to 24 were prepared.

TABLE 1

| | Coating layer | | | | | | |
|---|---|---|---|---|---|---|---|
| | | | Lower layer | | | | |
| | Bottom layer | | First thin layer | | Second thin layer | | |
| Present product | Composition | Layer thickness (nm) | Composition | Layer thickness (nm) | Composition | Layer thickness (nm) | Layer thickness (μm) |
| 1 | $Al_{0.70}Cr_{0.30}N$ | 100 | $Ti_{0.50}Al_{0.50}N$ | 80 | $Al_{0.70}Cr_{0.30}N$ | 80 | 1.4 |
| 2 | $Al_{0.50}Cr_{0.50}N$ | 150 | $Ti_{0.30}Al_{0.70}N$ | 150 | $Al_{0.50}Cr_{0.50}N$ | 150 | 1.8 |
| 3 | $Al_{0.80}Cr_{0.20}N$ | 70 | $Ti_{0.60}Al_{0.40}N$ | 70 | $Al_{0.80}Cr_{0.20}N$ | 70 | 1.1 |
| 4 | $Al_{0.70}Cr_{0.30}N$ | 100 | $Ti_{0.85}Si_{0.15}N$ | 75 | $Al_{0.70}Cr_{0.30}N$ | 75 | 1.2 |
| 5 | $Al_{0.50}Cr_{0.50}N$ | 150 | $Ti_{0.95}Si_{0.05}N$ | 150 | $Al_{0.50}Cr_{0.50}N$ | 150 | 1.8 |
| 6 | $Al_{0.80}Cr_{0.20}N$ | 70 | $Ti_{0.70}Si_{0.30}N$ | 70 | $Al_{0.80}Cr_{0.20}N$ | 70 | 1.1 |
| 7 | None | — | $Ti_{0.50}Al_{0.50}N$ | 80 | $Al_{0.70}Cr_{0.30}N$ | 80 | 1.4 |
| 8 | None | — | $Ti_{0.85}Si_{0.15}N$ | 75 | $Al_{0.70}Cr_{0.30}N$ | 75 | 1.2 |
| 9 | $Al_{0.70}Cr_{0.30}N$ | 200 | $Ti_{0.50}Al_{0.50}N$ | 200 | $Al_{0.70}Cr_{0.30}N$ | 200 | 2.8 |
| 10 | $Al_{0.70}Cr_{0.30}N$ | 60 | $Ti_{0.50}Al_{0.50}N$ | 60 | $Al_{0.70}Cr_{0.30}N$ | 60 | 0.6 |
| 11 | $Al_{0.70}Cr_{0.30}N$ | 100 | $Ti_{0.50}Al_{0.50}N$ | 80 | $Al_{0.70}Cr_{0.30}N$ | 80 | 1.4 |
| 12 | $Al_{0.70}Cr_{0.30}N$ | 100 | $Ti_{0.85}Si_{0.15}N$ | 75 | $Al_{0.70}Cr_{0.30}N$ | 75 | 1.2 |
| 13 | $Al_{0.70}Cr_{0.30}N$ | 100 | $Ti_{0.85}Si_{0.15}N$ | 75 | $Al_{0.70}Cr_{0.30}N$ | 75 | 1.2 |
| 14 | $Al_{0.70}Cr_{0.30}N$ | 100 | $Ti_{0.85}Si_{0.15}N$ | 75 | $Al_{0.70}Cr_{0.30}N$ | 75 | 1.2 |
| 15 | $Al_{0.70}Cr_{0.30}N$ | 100 | $Ti_{0.50}Al_{0.50}N$ | 75 | $Al_{0.70}Cr_{0.30}N$ | 75 | 1.2 |
| 16 | $Al_{0.50}Zr_{0.50}N$ | 100 | $Ti_{0.50}Al_{0.50}N$ | 80 | $Al_{0.50}Zr_{0.50}N$ | 80 | 1.4 |
| 17 | $Al_{0.50}Zr_{0.50}N$ | 100 | $Ti_{0.85}Si_{0.15}N$ | 80 | $Al_{0.50}Zr_{0.50}N$ | 80 | 1.4 |
| 18 | $Al_{0.50}Nb_{0.50}N$ | 100 | $Ti_{0.50}Al_{0.50}N$ | 80 | $Al_{0.50}Nb_{0.50}N$ | 80 | 1.4 |
| 19 | $Al_{0.50}Nb_{0.50}N$ | 100 | $Ti_{0.85}Si_{0.15}N$ | 80 | $Al_{0.50}Nb_{0.50}N$ | 80 | 1.4 |
| 20 | $Al_{0.50}Ti_{0.50}N$ | 100 | $Ti_{0.85}Si_{0.15}N$ | 80 | $Al_{0.50}Ti_{0.50}N$ | 80 | 1.4 |
| 21 | $Al_{0.70}Cr_{0.30}N$ | 100 | $Ti_{0.85}Si_{0.15}N$ | 75 | $Al_{0.70}Cr_{0.30}N$ | 75 | 1.2 |
| 22 | $Al_{0.70}Cr_{0.30}N$ | 100 | $Ti_{0.85}Si_{0.15}N$ | 75 | $Al_{0.70}Cr_{0.30}N$ | 75 | 1.2 |
| 23 | $Al_{0.70}Cr_{0.30}N$ | 100 | $Ti_{0.85}Si_{0.15}N$ | 75 | $Al_{0.70}Cr_{0.30}N$ | 75 | 1.2 |
| 24 | $Al_{0.7}Cr_{0.3}N$ | 100 | $Ti_{0.5}Al_{0.5}CN$ | 80 | $Al_{0.7}Cr_{0.3}CN$ | 80 | 1.4 |
| 25 | $Al_{0.7}Cr_{0.3}N$ | 100 | $Ti_{0.85}Si_{0.15}CN$ | 75 | $Al_{0.7}Cr_{0.3}CN$ | 75 | 1.2 |

| | Coating layer | | | | | |
|---|---|---|---|---|---|---|
| | Intermediate layer | | Upper layer | | | Whole |
| Present product | Composition | Layer thickness (nm) | Composition | Layer thickness (μm) | FWHM (°) | layer thickness (μm) |
| 1 | $Ti_{0.50}Al_{0.50}$ | 60 | $Ti_{0.50}Al_{0.50}N$ | 1.0 | 0.31 | 2.6 |
| 2 | $Ti_{0.50}Al_{0.50}$ | 80 | $Ti_{0.50}Al_{0.50}N$ | 1.5 | 0.34 | 3.5 |
| 3 | $Ti_{0.50}Al_{0.50}$ | 50 | $Ti_{0.50}Al_{0.50}N$ | 1.0 | 0.38 | 2.2 |
| 4 | Ti | 50 | TiCN | 1.0 | 0.73 | 2.3 |
| 5 | Ti | 80 | TiCN | 1.5 | 0.77 | 3.5 |
| 6 | Ti | 50 | TiCN | 1.0 | 0.65 | 2.2 |
| 7 | None | — | $Ti_{0.50}Al_{0.50}N$ | 1.0 | 0.31 | 2.6 |
| 8 | None | — | TiCN | 1.0 | 0.83 | 2.3 |
| 9 | $Ti_{0.50}Al_{0.50}$ | 100 | $Ti_{0.50}Al_{0.50}N$ | 3.0 | 0.29 | 6.1 |
| 10 | $Ti_{0.50}Al_{0.50}$ | 5 | $Ti_{0.50}Al_{0.50}N$ | 0.5 | 0.31 | 1.2 |

TABLE 1-continued

| | | | | | | |
|---|---|---|---|---|---|---|
| 11 | Ti | 60 | TiCN | 2.0 | 0.72 | 3.6 |
| 12 | $Ti_{0.50}Al_{0.50}$ | 50 | $Ti_{0.50}Al_{0.50}N$ | 1.5 | 0.35 | 2.3 |
| 13 | Ti | 50 | TiN | 1.5 | 0.24 | 2.9 |
| 14 | None | — | $Al_2O_3$ | 0.5 | 0.46 | 1.9 |
| 15 | None | — | $Al_2O_3$ | 0.5 | 0.44 | 1.8 |
| 16 | $Ti_{0.50}Al_{0.50}$ | 60 | $Ti_{0.50}Al_{0.50}N$ | 1.0 | 0.33 | 2.6 |
| 17 | Ti | 60 | TiCN | 1.0 | 0.73 | 2.6 |
| 18 | $Ti_{0.50}Al_{0.50}$ | 60 | $Ti_{0.50}Al_{0.50}N$ | 1.0 | 0.34 | 2.6 |
| 19 | Ti | 60 | TiCN | 1.0 | 0.65 | 2.6 |
| 20 | $Ti_{0.50}Al_{0.50}$ | 60 | $Ti_{0.50}Al_{0.50}N$ | 1.0 | 0.33 | 2.6 |
| 21 | $Ti_{0.85}Si_{0.15}$ | 50 | $Ti_{0.85}Si_{0.15}N$ | 1.5 | 0.31 | 2.8 |
| 22 | $Ti_{0.40}Al_{0.50}Nb_{0.10}$ | 50 | $Ti_{0.40}Al_{0.50}Nb_{0.10}N$ | 1.5 | 0.35 | 2.8 |
| 23 | $Zr_{0.50}Al_{0.50}$ | 50 | $Zr_{0.50}Al_{0.50}N$ | 1.5 | 0.66 | 2.8 |
| 24 | $Ti_{0.5}Al_{0.5}$ | 60 | $Ti_{0.5}Al_{0.5}N$ | 1.0 | 0.31 | 2.6 |
| 25 | Ti | 50 | TiCN | 1.0 | 0.73 | 2.3 |

Coated cubic boron nitride sintered body tools of Present products 4 to 6, 8, 11, 17, 19 and 25 were prepared by forming coating layers under the following conditions on the substrates prepared by the same method as mentioned above.

With regard to Present products 4 to 6, 11, 17, 19 and 25 except for Present product 8, in the state of rotating the table, a flow amount of nitrogen gas which is a reaction gas to be introduced into the device was adjusted to set pressure in the device at 3.0 Pa, a substrate direct current bias voltage was adjusted to −40V, an arc current of 150 A was supplied to a cathode electrode arranging metal targets corresponding to metal elements of the bottom layer shown in Table 1, a discharge time was changed in the range of 5 to 15 minutes depending on a thickness of a layer to be formed to coat the bottom layer, and then, arc discharge was stopped.

Subsequently, with regard to Present products 4 to 6, 8, 11, 17, 19 and 25, in the state of rotating the table, a flow rate of nitrogen gas (in Present product 25, nitrogen gas and acetylene gas with a flow ratio (volume ratio) of 2:1) which is a reaction gas to be introduced into the device was adjusted to set pressure in the device at 3.0 Pa, while maintaining a substrate direct current bias voltage at −40V, an arc current of 150 A was supplied to a cathode electrode arranging metal targets corresponding to metal elements of the first thin layer of the lower layer shown in Table 1, a discharge time was changed in the range of 2 to 12 minutes depending on a thickness of a layer to be formed to coat the first thin layer of the lower layer. After coating the first thin layer, the arc discharge was stopped, an arc current of 150 A was supplied to a cathode electrode arranging metal targets corresponding to metal elements of the second thin layer of the lower layer shown in Table 1, and a discharge time was changed in the range of 8 to 25 minutes depending on a thickness of a layer to be formed to coat the second thin layer of the lower layer. These processes were repeated whereby the alternately laminated lower layer in which the first thin layer and the second thin layer had been alternately laminated with each 6 to 9 layers was coated, and then, the arc discharge was stopped and nitrogen gas which is the reaction gas (in Present product 25, nitrogen gas and acetylene gas) was exhausted.

After covering the alternately laminated lower layer, with regard to Present products 4 to 6, 11, 17, 19 and 25 except for Present product 8, argon gas was introduced, pressure in the device was maintained at 3.0 Pa, in the state of applying a substrate direct current bias voltage of −40V to the substrate, an arc current of 80 A was supplied to a cathode electrode arranging a Ti target, a discharge time was changed in the range of 3 to 20 minutes depending on a thickness of a layer to be formed to coat an intermediate layer, and then, the arc discharge was stopped and argon gas was exhausted.

Subsequently, with regard to Present products 4 to 6, 8, 11, 17 and 19, flow amounts of nitrogen gas and acetylene gas with a flow ratio (volume ratio) of 2:1 which are reaction gases to be introduced into the device were adjusted to set pressure in the device at 3.0 Pa, a substrate direct current bias voltage was adjusted to −100V, an arc current of 150 A was supplied to a cathode electrode arranging a Ti target, a discharge time was changed in the range of 15 to 90 minutes depending on a thickness of a layer to be formed to coat the upper layer, and then, the arc discharge was stopped and nitrogen gas and acetylene gas which are the reaction gases were exhausted. According to the above procedures, the coated cubic boron nitride sintered body tools of Present products 4 to 6, 8, 11, 17, 19 and 25 were prepared.

Coated cubic boron nitride sintered body tools of Present products 14 and 15 were prepared by forming coating layers under the following conditions on the substrates prepared by the same method as mentioned above.

In the state of rotating the table, a flow amount of nitrogen gas which is a reaction gas to be introduced into the device was adjusted to set pressure in the device at 3.0 Pa, a substrate direct current bias voltage was adjusted to −40V, an arc current of 150 A was supplied to a cathode electrode arranging metal targets corresponding to metal elements of the bottom layer shown in Table 1 for 10 minutes to coat the bottom layer on the surface of the substrate, and then, the arc discharge was stopped.

Subsequently, in the state of rotating the table, a flow amount of nitrogen gas which is a reaction gas to be introduced into the device was adjusted to set pressure in the device at 3.0 Pa, while maintaining a substrate direct current bias voltage at −40V, an arc current of 150 A was supplied to a cathode electrode arranging metal targets corresponding to metal elements of the first thin layer of the lower layer shown in Table 1 for 9.5 minutes to coat the first thin layer of the lower layer. After coating the first thin layer, arc discharge was stopped and an arc current of 150 A was supplied to a cathode electrode arranging metal targets corresponding to metal elements of the second thin layer of the lower layer shown in Table 1 for 7.5 minutes to coat the second thin layer of the lower layer. These processes were repeated whereby the alternately laminated lower layer in which the first thin layer and the second thin layer had been alternately laminated with each 8 layers was coated, and then, the arc discharge was stopped and nitrogen gas which is the reaction gas was exhausted.

Subsequently, a flow amount of oxygen gas which is a reaction gas to be introduced into the device was adjusted to set pressure in the device at 3.0 Pa, a substrate pulse direct current bias voltage of −700V was applied to the substrate, an arc current of 200 A was supplied to a cathode electrode arranging an Al target for 65 minutes to coat an upper layer, and then, the arc discharge was stopped and oxygen gas which is a reaction gas was exhausted. According to the above procedures, the coated cubic boron nitride sintered body tools of Present products 14 and 15 were prepared.

With regard to the obtained Present products, SEM observation, EDS measurement attached to SEM, TEM observation, and EDS measurement attached to TEM were carried out to evaluate layer thickness and composition of the respective layers. Also, according to the commercially available X-ray diffraction device, X-ray diffraction measurement was carried out under the measurement conditions of Cu—Kα radiation, output: voltage of 50 kV, current of 250 mA, step width: 0.02°, 2θ/θ series, and 2θ measurement range: 4° to 140°. In the 2θ measurement range: 4° to 140°, a FWHM was measured with regard to the diffraction line having the highest peak intensity among the obtained diffraction lines of the upper layer. These results are shown in Table 1.

With regard to Comparative products, on the substrate prepared in the same manner as in Present products, a coating layer comprising a lower layer and an upper layer was formed under the following conditions without forming a bottom layer and an intermediate layer.

With regard to coated cubic boron nitride sintered body tools of Comparative products 1 to 3, 5 and 7, in the state of rotating the table, a flow amount of nitrogen gas which is introduced into the device was adjusted to set pressure in the device at 3.0 Pa, a substrate direct current bias voltage was adjusted to −40V, and an arc current of 150 A was supplied to a cathode electrode arranging metal targets corresponding to metal elements of the first thin layer of the lower layer shown in Table 2 to coat the first thin layer of the lower layer. After coating the first thin layer, the arc discharge was stopped and an arc current of 150 A was supplied to a cathode electrode arranging metal targets corresponding to metal elements of the second thin layer of the lower layer shown in Table 2 to coat the second thin layer of the lower layer. These processes were repeated to coat an alternately laminated lower layer in which the first thin layer and the second thin layer had been alternately laminated with each 10 to about 40 layers. Incidentally, the arc discharge time was in the range of 3 to 11 minutes for the first thin layer and in the range of 2 to 8 minutes for the second thin layer.

Subsequently, in the state of rotating the table, a flow amount of nitrogen gas which is introduced into the device was adjusted to set pressure in the device at 3.0 Pa, while maintaining a substrate direct current bias voltage at −40V, an arc current of 150 A was supplied to a cathode electrode arranging metal targets corresponding to metal elements of the upper layer shown in Table 2 for 28 to 105 minutes to coat the upper layer, and then, the arc discharge was stopped and nitrogen gas which is the reaction gas was exhausted. According to the above procedures, the coated cubic boron nitride sintered body tools of Comparative products 1 to 3, 5 and 7 were prepared.

TABLE 2

| | Coating layer | | | | | | | |
|---|---|---|---|---|---|---|---|---|
| | Lower layer | | | | | | | |
| Comparative product | First thin layer | | Second thin layer | | | Upper layer | | Whole |
| | Composition | Layer thickness (nm) | Composition | Layer thickness (nm) | Layer thickness (μm) | Composition | Layer thickness (μm) | layer thickness (μm) |
| 1 | TiN | 80 | AlN | 80 | 1.6 | $Ti_{0.50}Al_{0.50}N$ | 1.0 | 2.6 |
| 2 | $Ti_{0.10}Al_{0.90}N$ | 80 | $Al_{0.10}Cr_{0.90}N$ | 80 | 1.6 | $Ti_{0.50}Al_{0.50}N$ | 1.0 | 2.6 |
| 3 | $Ti_{0.50}Al_{0.50}N$ | 20 | $Al_{0.50}Cr_{0.50}N$ | 20 | 1.5 | $Ti_{0.50}Al_{0.50}N$ | 1.0 | 2.5 |
| 4 | $Ti_{0.85}Si_{0.15}N$ | 250 | $Al_{0.70}Cr_{0.30}N$ | 250 | 1.5 | TiCN | 1.0 | 2.5 |
| 5 | $Ti_{0.50}Al_{0.50}N$ | 80 | $Al_{0.50}Cr_{0.50}N$ | 80 | 0.3 | $Ti_{0.50}Al_{0.50}N$ | 1.5 | 1.8 |
| 6 | $Ti_{0.85}Si_{0.15}N$ | 80 | $Al_{0.70}Cr_{0.30}N$ | 80 | 3.5 | TiCN | 1.0 | 4.5 |
| 7 | $Ti_{0.50}Al_{0.50}N$ | 80 | $Al_{0.50}Cr_{0.50}N$ | 80 | 2.1 | $Ti_{0.50}Al_{0.50}N$ | 0.4 | 2.5 |
| 8 | $Ti_{0.85}Si_{0.15}N$ | 80 | $Al_{0.70}Cr_{0.30}N$ | 80 | 1.6 | TiCN | 3.5 | 5.1 |
| 9 | $Ti_{0.50}Al_{0.50}N$ | 20 | $Al_{0.50}Cr_{0.50}N$ | 20 | 2.0 | — | — | 2.0 |

With regard to coated cubic boron nitride sintered body tools of Comparative products 4, 6 and 8, in the state of rotating the table, a flow amount of nitrogen gas which is introduced into the device was adjusted to set pressure in the device at 3.0 Pa, a substrate direct current bias voltage was adjusted to −40V, an arc current of 150 A was supplied to a cathode electrode arranging metal targets corresponding to metal elements of the first thin layer of the lower layer shown in Table 2 to coat the first thin layer of the lower layer. After coating the first thin layer, the arc discharge was stopped and an arc current of 150 A was supplied to a cathode electrode arranging metal targets corresponding to metal elements of the second thin layer of the lower layer shown in Table 2 to coat the second thin layer of the lower layer. These processes were repeated to coat an alternately laminated lower layer in which the first thin layer and the second thin layer had been alternately laminated with each 3 to 22 layers, and then, the arc discharge was stopped and nitrogen gas which is the reaction gas was exhausted. Incidentally, the arc discharge time was in the range of 3 to 9 minutes for the first thin layer and in the range of 7 to 21 minutes for the second thin layer.

Subsequently, flow amounts of nitrogen gas and acetylene gas with a flow ratio (volume ratio) of 2:1 which are reaction gases to be introduced into the device were adjusted to set pressure in the device at 3.0 Pa, a substrate direct current bias voltage was adjusted to −100V, an arc current of 150 A was supplied to a cathode electrode arranging a Ti target for 30 to 105 minutes to coat an upper layer, and then, the arc discharge was stopped and nitrogen gas and acetylene gas which are the reaction gases were exhausted. According to the above procedures, the coated cubic boron nitride sintered body tools of Comparative products 4, 6 and 8 were prepared.

With regard to a coated cubic boron nitride sintered body tool of Comparative product 9, a flow amount of nitrogen gas which is a reaction gas to be introduced into the device was adjusted to set pressure in the device at 3.0 Pa, a substrate direct current bias voltage was adjusted to −40V, an arc current of 150 A was supplied to a cathode electrode arranging metal targets corresponding to metal elements of the first thin layer shown in Table 2 for 3 minutes to coat the first thin layer. After coating the first thin layer, the arc discharge was stopped and an arc current of 150 A was supplied to a cathode electrode arranging metal targets corresponding to metal elements of the second thin layer shown in Table 2 for 2 minutes to coat the second thin layer. These processes were repeated to coat an alternately laminated coating layer in which the first thin layer and the second thin layer had been alternately laminated with each 50 layers, and then, the arc discharge was stopped and nitrogen gas which is the reaction gas was exhausted. According to the above procedures, the coated cubic boron nitride sintered body tool of Comparative product 9 was prepared.

With regard to the obtained Comparative products 1 to 9, SEM observation, EDS measurement attached to SEM, TEM observation, EDS measurement attached to TEM were carried out to evaluate a layer thickness and composition of the respective layers, and the results are shown in Table 2.

With regard to a coated cubic boron nitride sintered body tool of Comparative product 10, a flow amount of nitrogen gas which is a reaction gas to be introduced into the device was adjusted to set pressure in the device at 3.0 Pa, a substrate direct current bias voltage was adjusted to −40V, an arc current of 150 A was supplied to a cathode electrode arranging metal targets corresponding to metal elements of the lower layer shown in Table 3 for 60 minutes to coat the lower layer.

Subsequently, in the state of rotating the table, a flow amount of nitrogen gas which is introduced into the device was adjusted to set pressure in the device at 3.0 Pa, while maintaining a substrate direct current bias voltage at −40V, an arc current of 150 A was supplied to a cathode electrode arranging metal targets corresponding to metal elements of the first thin layer of the upper layer shown in Table 3 for 11 minutes to coat the first thin layer of the upper layer. After coating the first thin layer, the arc discharge was stopped and an arc current of 150 A was supplied to a cathode electrode arranging metal targets corresponding to metal elements of the second thin layer of the upper layer shown in Table 3 in the same manner as in the first thin layer to coat the second thin layer of the upper layer. These processes were repeated to coat an alternately laminated upper layer in which the first thin layer and the second thin layer had been alternately laminated with each 10 layers, and then, the arc discharge was stopped and nitrogen gas which is the reaction gas was exhausted. According to the above procedures, the coated cubic boron nitride sintered body tool of Comparative product 10 was prepared.

With regard to a coated cubic boron nitride sintered body tool of Comparative product 11, a flow amount of nitrogen gas which is a reaction gas to be introduced into the device was adjusted to set pressure in the device at 3.0 Pa, a substrate direct current bias voltage was adjusted to −40V, and an arc current of 150 A was supplied to a cathode electrode arranging a Ti target for 30 minutes to coat the lower layer.

Subsequently, in the state of rotating the table, a flow amount of nitrogen gas which is introduced into the device was adjusted to set pressure in the device at 3.0 Pa, while maintaining a substrate direct current bias voltage at −40V, an arc current of 150 A was supplied to a cathode electrode arranging metal targets corresponding to metal elements of the upper layer shown in Table 3 for 140 minutes to coat the upper layer. According to the above procedures, the coated cubic boron nitride sintered body tool of Comparative product 11 was prepared.

With regard to a coated cubic boron nitride sintered body tool of Comparative product 12, a flow amount of nitrogen gas which is a reaction gas to be introduced into the device was adjusted to set pressure in the device at 3.0 Pa, a substrate direct current bias voltage was adjusted to −40V, and an arc current of 150 A was supplied to a cathode electrode for 200 minutes to coat the coating layer. According to the above procedures, the coated cubic boron nitride sintered body tool of Comparative product 12 was prepared.

With regard to the obtained Comparative products 10 to 12, SEM observation, EDS measurement attached to SEM, TEM observation, EDS measurement attached to TEM were carried out to evaluate a layer thickness and a composition of the respective layers, and the results are shown in Table 3.

With regard to the obtained Present products and Comparative products, the following Cutting tests [1], [2] and [3] were carried out.

Cutting test [1]: Continuous cutting
Cutting form: Outer diameter continuous turning, DRY
Material to be cut: SCM415H (case hardening steel), HRC58 to 62, cylindrical shape (outer diameter 63 mm, length 200 mm)
Cutting speed: 150 (m/min)
Feed: 0.10 (mm/rev)
Depth of cut: 0.25 (mm)
Tool lifetime: machining time until a flank wear width became 0.15 mm or machining time until blade edge fracture occurred Cutting test [2]: High speed continuous cutting
Cutting form: Outer diameter continuous turning, DRY
Material to be cut: SCM415H (case hardening steel), HRC58 to 62, cylindrical shape (outer diameter 63 mm, length 200 mm)
Cutting speed: 250 (m/min)

TABLE 3

| | Coating layer | | | | | | | |
|---|---|---|---|---|---|---|---|---|
| | | | Upper layer | | | | | |
| Com- | Lower layer | | First thin layer | | Second thin layer | | | Whole |
| parative product | Composition | Layer thickness (μm) | Composition | Layer thickness (nm) | Composition | Layer thickness (nm) | Layer thickness (μm) | layer thickness (μm) |
| 10 | $Ti_{0.50}Al_{0.50}N$ | 1.0 | $Ti_{0.50}Al_{0.50}N$ | 80 | $Al_{0.50}Cr_{0.50}N$ | 80 | 1.6 | 2.6 |
| 11 | TiN | 1.0 | $Ti_{0.50}Al_{0.50}N$ | | | | 2.0 | 3.0 |
| 12 | $Ti_{0.50}Al_{0.50}N$ | | | | | | | 3.0 |

Feed: 0.10 (mm/rev)
Depth of cut: 0.25 (mm)
Tool lifetime: Machining time until a flank wear width became 0.15 mm or machining time until blade edge fracture occurred
Cutting test [3]: Interrupted cutting
Cutting form: Outer diameter interrupted turning, DRY
Material to be cut: SCM435H (case hardening steel), HRC58 to 60, cylindrical shape with 2 V-shaped grooves (outer diameter 48 mm, length 200 mm)
Cutting speed: 150 (m/min)
Feed: 0.10 (mm/rev)
Depth of cut: 0.25 (mm)
Tool lifetime: Machining time until a flank wear width became 0.15 mm or machining time until blade edge fracture occurred In Table 4, tool lifetimes in Cutting tests [1], [2] and [3] are described. Also, comprehensive evaluation was carried out with regard to cutting properties of Present products and Comparative products in view of tool lifetimes and damaged shapes in Cutting tests [1], [2] and [3]. With regard to tool lifetimes of Cutting tests [1], [2] and [3], in Cutting test [1], rating of points was carried out wherein 65 to 55 minutes were evaluated as 1 point, 54 to 45 minutes as 2 points, 44 to 35 minutes as 3 points, 34 to 30 minutes as 4 points, and 29 minutes or shorter as 5 points. In Cutting test [2], rating of points was carried out wherein 25 to 20 minutes were evaluated as 1 point, 19 to 15 minutes as 2 points, 14 to 10 minutes as 3 points, 9 to 5 minutes as 4 points, and 4 minutes or shorter as 5 points. In Cutting test [3], rating of points was carried out wherein 36 to 30 minutes were evaluated as 1 point, 29 to 25 minutes as 2 points, 24 to 20 minutes as 3 points, 19 to 15 minutes as 4 points, and 14 minutes or shorter as 5 points. Next, points in Cutting tests [1], [2] and [3] were added up, and comprehensive evaluation (good ◎>○>Δ>▲>x bad) was carried out wherein 5 to 6 points were evaluated as ◎, 7 to 8 points as ○, 9 points as Δ, 10 to 11 points as ▲, and 12 to 13 points as x. The results of the comprehensive evaluation are also shown in Table 4.

TABLE 4

| | | Tool lifetime (min) | | | |
|---|---|---|---|---|---|
| | | [1] Continuous cutting | [2] High speed Continuous cutting | [3] Interrupted cutting | Overall evaluation |
| Present products | 1 | 56 | 14 | 32 | ◎ |
| | 2 | 58 | 11 | 36 | ◎ |
| | 3 | 45 | 14 | 29 | ○ |
| | 4 | 60 | 18 | 26 | ◎ |
| | 5 | 65 | 23 | 24 | ◎ |
| | 6 | 53 | 18 | 22 | ○ |
| | 7 | 55 | 13 | 29 | ◎ |
| | 8 | 58 | 19 | 22 | ◎ |
| | 9 | 62 | 9 | 27 | ○ |
| | 10 | 40 | 15 | 25 | ○ |
| | 11 | 65 | 25 | 24 | ◎ |
| | 12 | 50 | 11 | 32 | ◎ |
| | 13 | 44 | 14 | 22 | Δ |
| | 14 | 39 | 20 | 27 | ◎ |
| | 15 | 39 | 21 | 24 | ○ |
| | 16 | 43 | 16 | 28 | ○ |
| | 17 | 51 | 23 | 26 | ◎ |
| | 18 | 49 | 9 | 30 | ○ |
| | 19 | 55 | 19 | 21 | ◎ |
| | 20 | 47 | 15 | 29 | ◎ |
| | 21 | 44 | 22 | 24 | ○ |
| | 22 | 48 | 16 | 27 | ◎ |
| | 23 | 47 | 14 | 28 | ○ |
| | 24 | 59 | 17 | 21 | ◎ |
| | 25 | 63 | 19 | 17 | ○ |
| Comparative products | 1 | 35 | 7 | 23 | ▲ |
| | 2 | 28 | 8 | 19 | x |
| | 3 | 31 | 5 (fracture) | 18 | x |
| | 4 | 35 | 15 | 14 (fracture) | ▲ |
| | 5 | 44 | 6 | 23 (fracture) | ▲ |
| | 6 | 38 | 13 | 19 | ▲ |
| | 7 | 31 | 6 (fracture) | 16 | x |
| | 8 | 35 | 15 | 10 (fracture) | ▲ |
| | 9 | 35 | 7 | 20 | ▲ |
| | 10 | 36 | 8 | 20 | ▲ |
| | 11 | 35 | 9 (fracture) | 18 | ▲ |
| | 12 | 45 | 4 (fracture) | 24 | ▲ |

From Table 4, it can be understood that Present products have longer tool lifetime in all of the machining conditions and good in comprehensive evaluation as compared with those of Comparative products.

UTILIZABILITY IN INDUSTRY

The coated cubic boron nitride sintered body tools of the present invention make it possible to elongate tool lifetimes by restraining abnormal wear such as progress of wear due to drop of grains of a coating layer or peeling off of the coating layer by thermal decomposition, improving thermal stability of the coating layer at high temperatures not to lower tool strength. In particular, it has high effects of elongating tool lifetime in high load cutting machining or high efficiency cutting machining such as machining of hardened steel, and therefore, it has high utilizability in industry.

The invention claimed is:

1. A coated cubic boron nitride sintered body tool which is a coated cubic boron nitride sintered body tool at least whose blade edge comprises a coated cubic boron nitride sintered body where the surface of a cubic boron nitride sintered body substrate is coated with a coating layer, wherein;

(1) the coating layer includes a lower layer and an upper layer, the lower layer being closer to the substrate than the upper layer, and an intermediate layer formed between the lower layer and the upper layer;

(2) the upper layer has an average thickness of 0.5 to 3.0 μm and comprises a compound represented by a compositional formula Mα, where M represents at least one element selected from Ti, V, Zr, Nb, Mo, Al and Si, and α represents at least one element selected from C, N, B and O;

(3) the lower layer has an average layer thickness of 0.5 to 3.0 μm and is an alternately laminated material in which a first thin layer having an average layer thickness of 60 to 200 nm is alternately laminated with a second thin layer having an average layer thickness of 60 to 200 nm, wherein:

(a) the first thin layer comprises a compound represented by the compositional formula $(Ti_{(1-x)}L_x)\beta$, where L represents at least one element selected from Al, B and Si, x represents an atomic ratio of L based on the sum of Ti and L, and satisfies $0.01 \leq x \leq 0.7$, and β represents at least one element selected from C and N, and (b) the second thin layer comprises a compound represented by the compositional formula $(Al_{(1-y)}J_y)\gamma$, where J represents at least one element selected from Ti, V, Cr, Zr, Nb and Mo, y represents an atomic ratio of J based on the sum of Al and J, and satisfies $0.1 \leq y \leq 0.5$, and $\gamma$ represents at least one element selected from C and N; and (4) the intermediate layer is a metal layer having an average layer thickness of 5 to 100 nm and formed of the same elements found in component M of the upper layer.

2. The coated cubic boron nitride sintered body tool according to claim 1, wherein the first thin layer of the lower layer is a layer of a compound represented by the compositional formula $(Ti_{(1-x)}Al_x)N$, where x represents an atomic ratio of Al based on the sum of Ti and Al, and satisfies $0.4 \leq x \leq 0.7$.

3. The coated cubic boron nitride sintered body tool according to claim 1, wherein the first thin layer of the lower layer is a layer of a compound represented by the compositional formula $(Ti_{(1-x)}Si_x)N$, where x represents an atomic ratio of Si based on the sum of Ti and Si, and satisfies $0.01 \leq x \leq 0.3$.

4. The coated cubic boron nitride sintered body tool according to claim 1, wherein the second thin layer of the lower layer is a layer of a compound represented by the compositional formula $(Al_{(1-y)}Cr_y)N$, where y represents an atomic ratio of Cr based on the sum of Al and Cr, and satisfies $0.2 \leq y \leq 0.4$.

5. The coated cubic boron nitride sintered body tool according to claim 1, wherein the tool has a bottom layer formed between the surface of the cubic boron nitride sintered body substrate and the lower layer, and the bottom layer has an average layer thickness of 60 to 200 nm and comprises a compound represented by the compositional formula $(Al_{(1-y)}Cr_y)N$, where y represents an atomic ratio of Cr based on the sum of Al and Cr, and satisfies $0.2 \leq y \leq 0.4$.

6. The coated cubic boron nitride sintered body tool according to claim 1, wherein the upper layer is an upper layer whose full width at half maximum intensity of a diffraction line having the highest peak intensity among the diffraction lines of an X-ray diffraction analysis using Cu—Kα radiation is 0.80° or less.

7. The coated cubic boron nitride sintered body tool according to claim 2, wherein the second thin layer of the lower layer is a layer of a compound represented by the compositional formula $(Al_{(1-y)}Cr_y)N$, where y represents an atomic ratio of Cr based on the sum of Al and Cr, and satisfies $0.2 \leq y \leq 0.4$.

8. The coated cubic boron nitride sintered body tool according to claim 3, wherein the second thin layer of the lower layer is a layer of a compound represented by the compositional formula $(Al_{(1-y)}Cr_y)N$, where y represents an atomic ratio of Cr based on the sum of Al and Cr, and satisfies $0.2 \leq y \leq 0.4$.

9. The coated cubic boron nitride sintered body tool according to claim 2, wherein the tool has a bottom layer formed between the surface of the cubic boron nitride sintered body substrate and the lower layer, and the bottom layer has an average layer thickness of 60 to 200 nm and comprises a compound represented by the compositional formula $(Al_{(1-y)}Cr_y)N$, where y represents an atomic ratio of Cr based on the sum of Al and Cr, and satisfies $0.2 \leq y \leq 0.4$.

10. The coated cubic boron nitride sintered body tool according to claim 3, wherein the tool has a bottom layer formed between the surface of the cubic boron nitride sintered body substrate and the lower layer, and the bottom layer has an average layer thickness of 60 to 200 nm and comprises a compound represented by the compositional formula $(Al_{(1-y)}Cr_y)N$, where y represents an atomic ratio of Cr based on the sum of Al and Cr, and satisfies $0.2 \leq y \leq 0.4$.

11. The coated cubic boron nitride sintered body tool according to claim 4, wherein the tool has a bottom layer formed between the surface of the cubic boron nitride sintered body substrate and the lower layer, and the bottom layer has an average layer thickness of 60 to 200 nm and comprises a compound represented by the compositional formula $(Al_{(1-y)}Cr_y)N$, where y represents an atomic ratio of Cr based on the sum of Al and Cr, and satisfies $0.2 \leq y \leq 0.4$.

12. The coated cubic boron nitride sintered body tool according to claim 7, wherein the tool has a bottom layer formed between the surface of the cubic boron nitride sintered body substrate and the lower layer, and the bottom layer has an average layer thickness of 60 to 200 nm and comprises a compound represented by the compositional formula $(Al_{(1-y)}Cr_y)N$, where y represents an atomic ratio of Cr based on the sum of Al and Cr, and satisfies $0.2 \leq y \leq 0.4$.

13. The coated cubic boron nitride sintered body tool according to claim 8, wherein the tool has a bottom layer formed between the surface of the cubic boron nitride sintered body substrate and the lower layer, and the bottom layer has an average layer thickness of 60 to 200 nm and comprises a compound represented by the compositional formula $(Al_{(1-y)}Cr_y)N$, where y represents an atomic ratio of Cr based on the sum of Al and Cr, and satisfies $0.2 \leq y \leq 0.4$.

14. The coated cubic boron nitride sintered body tool according to claim 2, wherein the upper layer is an upper layer whose full width at half maximum intensity of a diffraction line having the highest peak intensity among the diffraction lines of an X-ray diffraction analysis using Cu—Kα radiation is 0.80° or less.

15. The coated cubic boron nitride sintered body tool according to claim 3, wherein the upper layer is an upper layer whose full width at half maximum intensity of a diffraction line having the highest peak intensity among the diffraction lines of an X-ray diffraction analysis using Cu—Kα radiation is 0.80° or less.

16. The coated cubic boron nitride sintered body tool according to claim 1, wherein:

the upper layer comprises a compound represented by TiN, TiCN, $Al_2O_3$, TiAlN, TiSiN, TiAlNbN, or ZrAlN.

17. The coated cubic boron nitride sintered body tool according to claim 1, wherein:

the upper layer comprises a compound represented by TiN, TiCN, $Al_2O_3$ or TiAlN.

18. The coated cubic boron nitride sintered body tool according to claim 1, wherein:

the upper layer comprises a compound represented by TiSiN, TiAlNbN, or ZrAlN.

* * * * *